United States Patent [19]

Shima et al.

[11] Patent Number: 4,717,844
[45] Date of Patent: Jan. 5, 1988

[54] PROGRAMMABLE LOGIC ARRAY CIRCUIT WITH A DECREASED NUMBER OF PRODUCT TERMS

[75] Inventors: Kazumasa Shima, Tokyo; Syunpei Kawasaki, Nakano; Takashige Kubo, Hachioji, all of Japan

[73] Assignee: Hitachi, Ltd., Tokyo, Japan

[21] Appl. No.: 833,266

[22] Filed: Feb. 27, 1986

[30] Foreign Application Priority Data

Mar. 4, 1985 [JP] Japan .................................. 60-41120

[51] Int. Cl.[4] ........................ G06F 7/38; H04Q 19/00
[52] U.S. Cl. .................................. 307/465; 364/716; 340/825.83
[58] Field of Search ............................ 307/465–466, 307/468–469, 443, 440; 364/716; 340/825.83

[56] References Cited

U.S. PATENT DOCUMENTS 4,041,459  8/1977  Horninger .......................... 307/468
4,336,468  6/1982  Spillman ........................... 307/465

Primary Examiner—John S. Heyman
Assistant Examiner—M. R. Wambach
Attorney, Agent, or Firm—Antonelli, Terry & Wands

[57] ABSTRACT

A programmable logic array circuit which assumes terms which are not implicants to be DON'T CARE terms, and which produces a logic function having decreased number of product terms; and which has a logic function which eliminates the terms that have been regarded to be DON'T CARE terms.

5 Claims, 8 Drawing Figures $F1 = \overline{X1} \cdot X2 \cdot \overline{X3} + \overline{X1} \cdot \overline{X3} \cdot X4 + X1 \cdot \overline{X2} \cdot X3 + X1 \cdot X3 \cdot \overline{X4}$ $F2 = X2 \cdot \overline{X3} \cdot X4 + \overline{X1} \cdot X2 \cdot X4$ $F3 = \overline{X1} \cdot \overline{X2} \cdot \overline{X3} \cdot \overline{X4} + X1 \cdot X2 \cdot X3 \cdot X4$

PROGRAMMABLE LOGIC ARRAY CIRCUIT WITH A DECREASED NUMBER OF PRODUCT TERMS

BACKGROUND OF THE INVENTION

The present invention relates to a programmable logic array circuit (hereinafter referred to as PLA) used for digital systems.

A conventional standard PLA consists, as shown in FIG. 1, of an input decode circuit 11, an AND array 12, an OR array 13, input lines 14, decoded input lines 15, product term lines 16, and output lines 17.

When the PLA is to be constituted on a chip, the required area S is approximately given by the following equation, $$S = k \times (n \times 2 + m) \times P \tag{1}$$

where n denotes the number of input lines, m denotes the number of output lines, P denotes the number of product term lines, and k denotes a constant.

In designing the PLA, it is essential to constitute the same function using a minimal area.

The PLA usually corresponds directly to an expression of a multiple-output logic function in the sum-of-products form. The PLA of FIG. 1 realizes a four-input three-output logic function which is represented by Boolean expression in FIG. 2, and wherein the input, output and product term of the logic function correspond to the input line, output line, and product term line of PLA.

In order to reduce the area S, the number P of product term lines must be decreased under a condition where the constant k, the number n of input lines, and the number m of output lines are kept unchanged in the equation (1). This, however, means that the number of product terms constituting a corresponding number of logic functions must be decreased.

Conventional arts for decreasing the number of product term lines in the PLA includes a system of partitioning inputs, for example, a method which employs a two-input four-output decoder for partitioning inputs as given in H. Fleisher and L. I. Meissel, "An introduction to array logic", IBM J. Res. Develop., Vol. 19, pp. 98–109, March 1975, and a system which is based upon the choice of correct output phase, for example, a method which selectively inserts a NOT gate into the rear stage of the OR array.

By these methods, however, there are some cases where it is not allowed to reduce the number of product term lines. Since conventional PLA's are constituted only by AND operations and OR operations, and do not have a sharp operation (an operation to a first product term to obtain a product term which is obtained by eliminating from the first product term a common part of the first product term and a second product term), such PLA's could not apply the characteristics of the sharp operation which can reduce the number of product terms of a logic function.

FIG. 3 expresses the logic functions of FIG. 2 in the form of Karnaugh maps, wherein reference numeral 31 represents that a minterm (smallest unit of product terms of a given combinational logic space) at that position is an implicant (product term contained in a given logic function) of the logic function. A loop 32 represents a product term.

As will be understood from the Karnaugh maps of FIG. 3, it is not possible to reduce any more the number of product terms constituting the logic functions with the PLA of the conventional art.

SUMMARY OF THE INVENTION

When the multiple-output function was to be realized with PLA's based on conventional arts, a limitation was imposed on decreasing the number of product term lines, and the area could not be reduced. The object of the present invention, therefore, is to provide a PLA which is capable of realizing equivalent logic functions with a decreased number of product term lines, and which provides a reduced area for constituting the PLA.

The above-mentioned object can be accomplished by the present invention. That is, when the logic function includes a DON'T CARE term (a term in logic space whose output logic value is not defined), the present invention utilizes the fact that there are some cases where the logically equivalent functions can be expressed with a decreased number of product terms. In a given logic function, terms which are intrinsically not implicated terms are once assumed to be DON'T CARE terms, in order to decrease the number of product terms. A logic function which implicates the terms regarded to be DON'T CARE terms is provided, and to which a logic function is added to subsequently eliminate the terms that have been regarded to be DON'T CARE terms. This makes it possible to realize an equivalent logic function with a decreased number of product terms compared with the one required by the initial logic function.

When a multiple-output logic function is to be realized according to the present invention, the number of product term lines constituting the PLA can be decreased compared with the one in the case of using PLA's based on conventional arts, and the PLA can be constituted on a chip requiring a reduced area.

DETAILED DESCRIPTION OF THE INVENTION

Based upon the idea of the present invention, described below is a method of realizing a multiple-output logic function that could be not realized with the PLA of the conventional art when the area (number of product term lines) was reduced, the method of the present invention requiring a reduced area (reduced number of product term lines). To begin with, the basic idea of reducing the number of product terms of logic functions in the present invention will be explained by using FIG. 2 as an example.

Figures 1, 2:
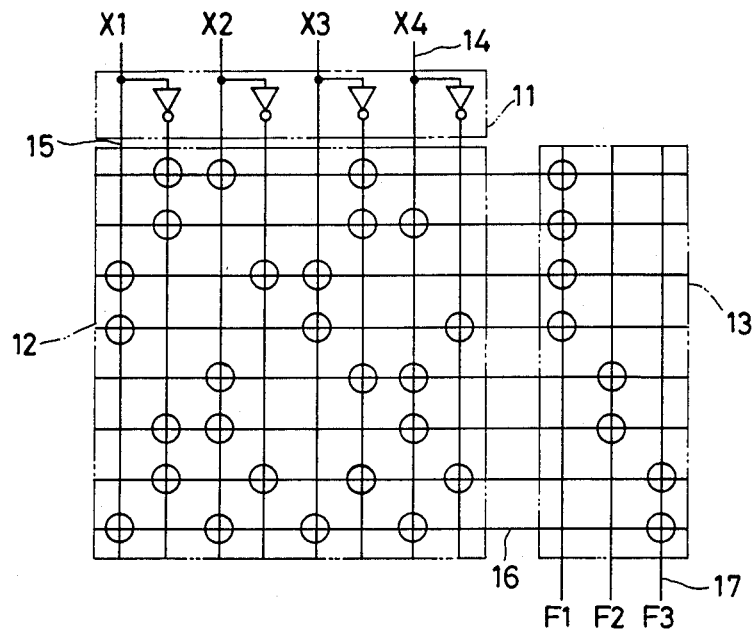
FIG. 1 is a diagram showing a PLA based on a conventional art.
FIG. 2 is a diagram which shows the logic realized by the PLA of FIG. 1 by the Boolean expression.

As FIG. 2 shows, and as illustrated in FIG. 1, the number of product terms according to the conventional Boolean algebra is eight terms (eight product term lines in FIG. 1). On the other hand, the present invention gives equivalent variation of the expressions of FIG. 2 as $$F1 = F1' \# F3$$
$$F2 = F2' \# F3$$
wherein,
$$F3 = \overline{x1} \cdot \overline{x2} \cdot \overline{x3} \cdot \overline{x4} + x1 \cdot x2 \cdot x3 \cdot x4 \quad (2)$$
$$F1' = \overline{x1} \cdot \overline{x3} + x1 \cdot x3$$
$$F2' = \overline{x2} \cdot \overline{x4},$$

where # designates the sharp operation. According to equations (2), all the product terms are only five, and three product terms are reduced as compared to the conventional expression of FIG. 2.

In a given multiple-output logic function, it is assumed that the implicant of some output functions are disjointed with respect to those of other output functions (do not have the same minterms in common in the input logic space). In this case, the logic function is divided into two logic functions. Namely, the logic function is so divided that minterms of outputs are disjointed relative to each other between the two logic functions after they have been divided. Therefore, the number of product terms after the division does not become greater than the number of product terms before the division.

Next, in one logic function (denoted by A) after the division, the implicant of the output of the other logic function (denoted by B) is regarded to be a DON'T CARE term (the logic function thereof is denoted by A'), and the number of product terms necessary for expressing the logic function A' is decreased so as to be as small as possible.

Then, a standard PLA (PLA of AND-OR two-stage structure) is provided for each of the two logic functions A', B found by the above-mentioned method. The two PLA's are denoted by PLA 1 and PLA 2.

A logic function (called a sharp operation) is added to the above-mentioned two PLA's in order to eliminate the implicant of the output of the logic function B realized by PLA 2 from the logic function A' which is realized by PLA 1. When either one of the outputs of PLA 2 assumes a positive logic value, this logic function can be realized by rendering causing the output of the AND array or the output of the OR array of PLA 1 to assume a negative logic value.

The logic function which causes a specific output of the AND array of the PLA 1 to be a negative logic value when either one of outputs of the PLA 2 is of a positive logic value, can be easily realized by combining the NOR gate with the AND array of an ordinary PLA. That is, an input line is added to the AND array of the PLA 1, and the output of the PLA 2 is input via the NOR gate. Further, when the logic value of the input line is of a negative value, a gate connection is provided at intersecting points of the input line and the product term lines such that logic values of particular product term lines will be negative value in the AND array of the PLA 1. The aforementioned logic function is thus realized.

When the implicant of some outputs is not disjointed relative to the implicant of other outputs in a given multiple-output logic function, the logic function is, first, referred to as A. Then, concerning the logic function A, there are found a set of combinations of input values which render all of the output value to be of negative logic values, and this set is referred to as logic function B. The same method as the above-mentioned one is then used.

The area S' which is required to constitute the thus determined new PLA on a chip, is approximately given by the following equation.

$$S' = S1 + S2 \quad (2)$$
$$S1 = k \times (n \times 2 + m1) \times P1 \quad (3)$$
$$S2 = k \times (n \times 2 + m2 + 1) \times P2 \quad (4)$$

where S1 denotes the area of PLA 1, S2 denotes the area of PLA 2, k denotes a constant, n denotes the number of input lines, m1 denotes the number of output lines of the PLA 1, P1 denotes the number of product term lines of the PLA 1, m2 denotes the number of output lines of the PLA 2, and P2 denotes the number of product term lines of the PLA 2. In the equations (1) and (2), it may be true that P1+P2<P. In this case, there holds S'<S.

DETAILED DESCRIPTION OF THE PREFERRED EMBODIMENT

An embodiment of the invention will be explained below in conjunction with FIGS. 1 to 6.

Figure 3:
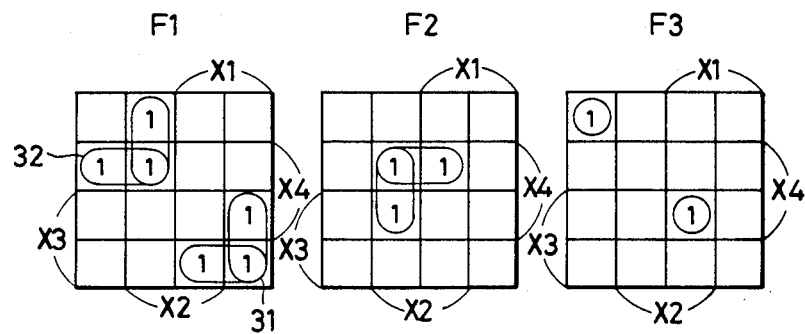
FIG. 3 is a diagram showing the logic corresponding to the PLA of FIG. 1 in the form of Karnaugh maps.

Considered below is the case where the logic function of four-input three-output configuration expressed by Karnaugh maps in FIG. 3 is realized by the PLA.

The inputs of this logic function are X1, X2, X3, X4, and the outputs are F1, F2, F3. The implicant of output F3 is disjointed relative to the implicants of outputs F1, F2. Therefore, the logic function is divided into two logic functions of (F1, F2) and (F3). The former is denoted by A, and the latter is denoted by B.

Figure 4:
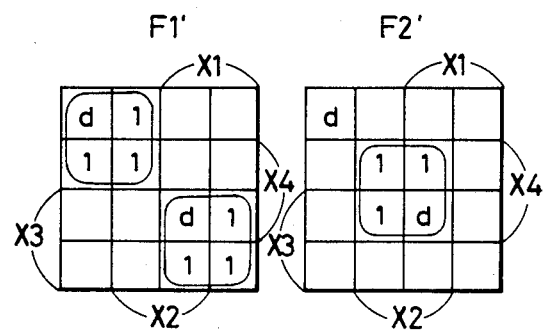
FIG. 4 is a diagram which shows an idea of the present invention in the form of Karnaugh maps, and which shows the logic obtained by adding DON'T CARE terms to one part of the logic of FIG. 3 divided into two.

Next, in the logic function A, the implicants of the logic function B are regarded to be DON'T CARE terms, and the logic function having the least number of product terms is denoted by A'. FIG. 4 shows the logic function A' which is expressed by Karnaugh maps, wherein symbol d represents the above-mentioned DON'T CARE terms. Outputs (F1, F2) of the logic function A becomes (F1', F2') in the logic function A'.

Figure 5:
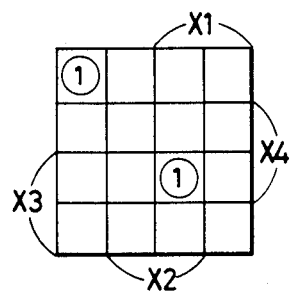
FIG. 5 is a diagram which shows the expression of Karnaugh map of a another part of the logic divided into two according to the idea of the present invention.
Figure 6:
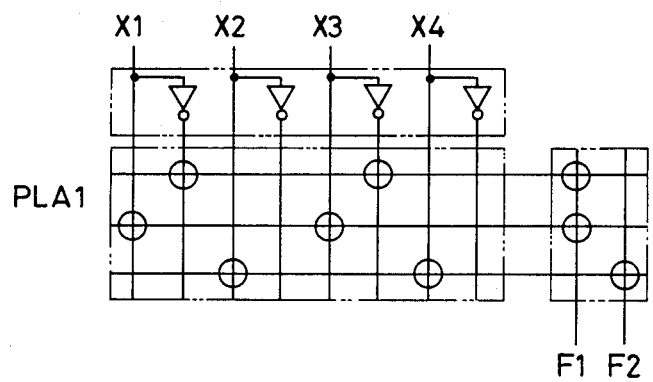
FIG. 6 is a diagram showing a logic circuit in which logic expressed by the Karnaugh map of FIG. 4 is realized by the ordinary PLA.
Figure 7:
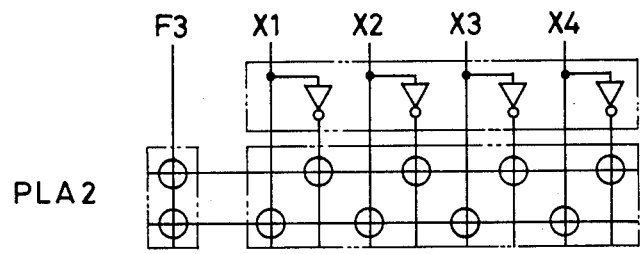
FIG. 7 is a diagram showing a logic circuit in which logic expressed by the Karnaugh map of FIG. 5 is realized by the ordinary PLA.

FIG. 5 shows the logic function B expressed by a Karnaugh map. The PLA's corresponding to the logic functions A', B are denoted by PLA 1, PLA 2, and are shown in FIGS. 6 and 7.

Figure 8:
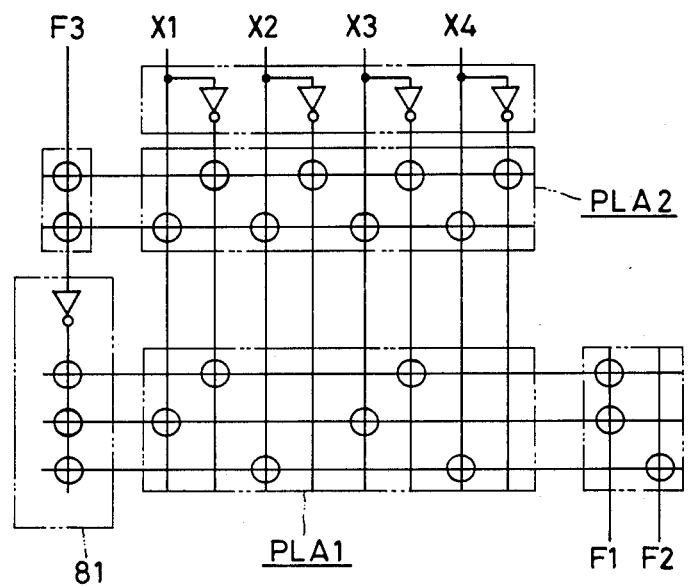
FIG. 8 is a diagram which shows the PLA according to an embodiment of the present invention, i.e., which shows the PLA that realizes the logic equivalent to the logic realized by the PLA of FIG. 1.

Next, in order to realize the original logic function (F1, F2, F3) by using these two PLA's, there is added a logic circuit 81 to realize the sharp operation in order to eliminate the implicants of the logic function B (F3) realized by the PLA 2 from the logic function A' (F1', F2') that is realized by the PLA 1. The logic circuit 81 includes an inverter for inverting the logic value produced by the PLA 2, and gate connections which forcibly make the values of product term lines of the PLA 1 negative values. FIG. 8 shows the whole structure of the PLA to which the sharp operation is added.

By using the PLA of such a structure, the original logic function (F1, F2, F3) is realized.

From the equations (2), (3) and (4), the area S' of PLA of this embodiment is found to be, $$S' = S1 + S2 = 51k$$

$$S1 = k \times (4 \times 2 + 1 + 2) \times 3 = 33k$$

$$S2 = k \times (4 \times 2 + 1) \times 2 = 18k$$

The same logic function that is realized by the PLA of the conventional art is as shown in FIG. 1. From the equation (1), the area S of this case is given by, $$S = k \times (4 \times 2 + 3) \times 8 = 88k$$

Therefore, a relation $S' < S$ holds true, and the area is reduced by about 40%.

What is claimed is:

1. A programmable logic array circuit comprising:
   a first AND array, a first OR array, a second AND array, and a second OR array, wherein the output of the first AND array is connected to the input of the first OR array, the output of the second AND array is connected to the input of the second OR array, the input of the first AND array is connected to the input of the second AND array; and
   logic circuit means responsive to the output of the second OR array having a positive logic value for causing the output of the first AND array or the first OR array to have a negative logic value.

2. A programmable logic array circuit according to claim 1, wherein the logic circuit means which causes the output of the first AND array to be of a negative logic value when the output of the second OR array contains a positive logic value, comprises:
   a NOT gate with its input being connected to the output of the second OR array;
   an input line added to the first AND array;
   a signal line which connects the output of said NOT gate to said input line; and
   a gate element which causes the logic value of said input line to be negative when said output of said NOT gate assumes a negative value.

3. A programmable logic array circuit, characterized in that, the logic of said logic array is separated into a first term set and a second term set, the terms of each of said term sets being disjointed with respect to the terms of the other term set, logic array circuit comprising:
   a first logic circuit constituted in accordance with said first term set having at least one term in common with said second term set as a DON'T CARE term; and
   a second logic circuit which subtracts said DON'T CARE term from said first and second term sets of said first logic circuit".

4. A programmable logic array circuit according to claim 3, wherein said first and second term sets are product term sets.

5. A programmable logic array circuit according to claim 3 or 4, wherein said first and second logic circuits are constituted by programmable logic arrays.

* * * * *